United States Patent [19]
Kuekes et al.

[11] Patent Number: 6,128,214
[45] Date of Patent: Oct. 3, 2000

[54] MOLECULAR WIRE CROSSBAR MEMORY

[75] Inventors: Philip J. Kuekes, Menlo Park; R. Stanley Williams, Mountain View; James R. Heath, Santa Monica, all of Calif.

[73] Assignee: Hewlett-Packard, Palo Alto, Calif.

[21] Appl. No.: 09/280,189

[22] Filed: Mar. 29, 1999

[51] Int. Cl.$^7$ .................................................. G11C 11/00
[52] U.S. Cl. ........................ 365/151; 365/153; 365/158
[58] Field of Search ................................. 365/151, 128, 365/171, 153, 158; 369/176, 101

[56] References Cited

U.S. PATENT DOCUMENTS

| | | | |
|---|---|---|---|
| 3,975,623 | 8/1976 | Weinberger | 235/152 |
| 4,208,728 | 6/1980 | Blahut et al. | 365/154 |
| 5,453,970 | 9/1995 | Rust et al. | 369/176 |
| 5,475,341 | 12/1995 | Reed | 327/566 |
| 5,519,629 | 5/1996 | Snider | 364/490 |
| 5,640,343 | 6/1997 | Gallagher et al. | 365/171 |
| 5,729,752 | 3/1998 | Snider et al. | 395/800 |
| 5,790,771 | 8/1998 | Culbertson et al. | 395/182.01 |
| 6,026,013 | 2/2000 | Peterson | 365/175 |

OTHER PUBLICATIONS

J.R. Heath et al, "A Defect–Tolerant Computer Architecture: Opportunities for Nanotechnology", Science, vol. 280, pp. 1716–1721 (Jun. 12, 1998).

L. Guo et al, "Nanoscale Silicon Field Effect Transistors Fabricated Using Imprint Lithography", Applied Physics Letters, vol. 71, pp. 1881–1883 (Sep. 29, 1997).

A.M. Morales et al, "A Laser Ablation Method For The Synthesis Of Crystalline Semiconductor Nanowires", Science, vol. 279, pp. 208–268 (Jan. 9, 1998).

J.R. Heath et al, "A Liquid Solution Synthesis Of Single Crystal Germanium Quantum Wires", Chemical Physics Letters, vol. 208, No. 3, 4, pp. 263–268 (Jun. 11, 1993).

V.P. Menon et al, "Fabrication and Evaluation Of Nanoelectrode Ensembles", Analytical Chemistry, vol. 67, pp. 1920–1928 (Jul. 1, 1995).

L. Guo et al, "A Silicon Single–Electron Transistor Memory Operating At Room Temperature", Science, vol. 275, pp. 649–651 (Jan. 31, 1997).

S.J. Tans et al, "Room–Temperature Transistor Based On A Single Carbon Nanotube", Nature, vol. 393, pp. 49–52 (May 7, 1998).

K.K. Likharev, "Correlated Discrete Transfer Of Single Electrons In Ultrasmall Tunnel Junctions", IBM Journal of Research and Development, vol. 32, No. 1, pp. 144–158 (Jan. 1998).

R.E. Jones Jr., et al, "Ferroelectric Non–Volatile Memories For Low–Voltage, Low–Power Applications", Thin Solid Films, vol. 270, pp. 584–588 (Dec. 1, 1995).

D.B. Amabilino et al, "Aggregation Of Self–Assembling Branched [n]–Rotaxanes", New Journal of Chemistry, vol. 22, No. 9, pp. 959–972 (Sep. 11, 1998).

T. Vossmeyer et al, "Combinatorial Approaches Toward Patterning Nanocrystals", Journal of Applied Physics, vol. 84, No. 7, pp. 3664–3670 (Oct. 1, 1998).

D.V. Leff et al, "Thermodynamic Control Of Gold Nanocrystal Size: Experiment And Theory", The Journal of Physical Chemistry, vol. 99, pp. 7036–7041 (May 4, 1995).

J.D.L. Holloway et al, "Electron–Transfer Reactions Of Metallocenes: Influence Of Metal Oxidation State On Structure And Reacivity", Journal of the American Chemical Society, vol. 101, pp. 2038–2044 (Apr. 11, 1979).

C. Mead et al, "Introduction to VLSI Systems", Addison–Wesley, Ch. 3, Section 10, pp. 79–82 (1980).

*Primary Examiner*—Son Mai

[57] ABSTRACT

A molecular wire crossbar memory (MWCM) system is provided. The MWCM comprises a two-dimensional array of a plurality of nanometer-scale devices, each device comprising a junction formed by a pair of crossed wires where one wire crosses another and at least one connector species connecting the pair of crossed wires in the junction. The connector species comprises a bi-stable molecular switch. The junction forms either a resistor or a diode or an asymmetric non-linear resistor. The junction has a state that is capable of being altered by application of a first voltage and sensed by application of a second, non-destructive voltage.

31 Claims, 6 Drawing Sheets

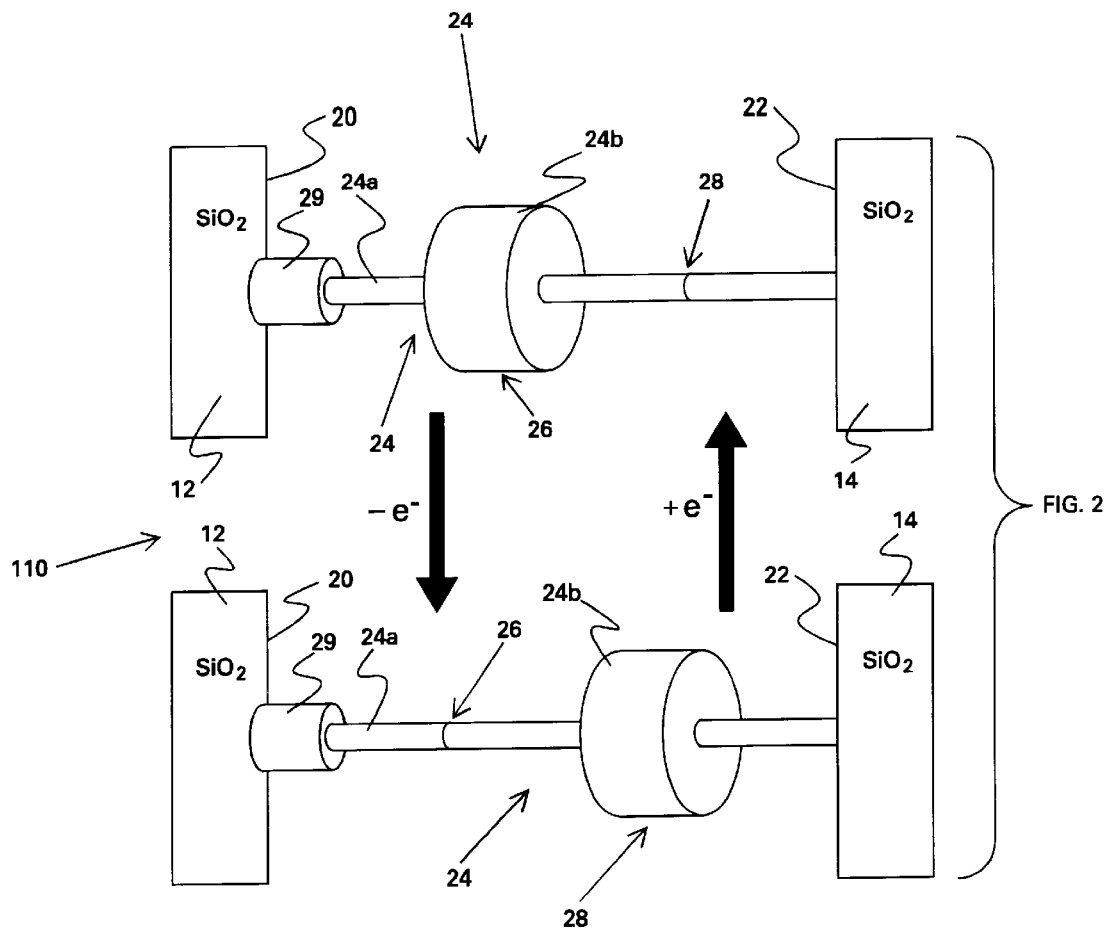
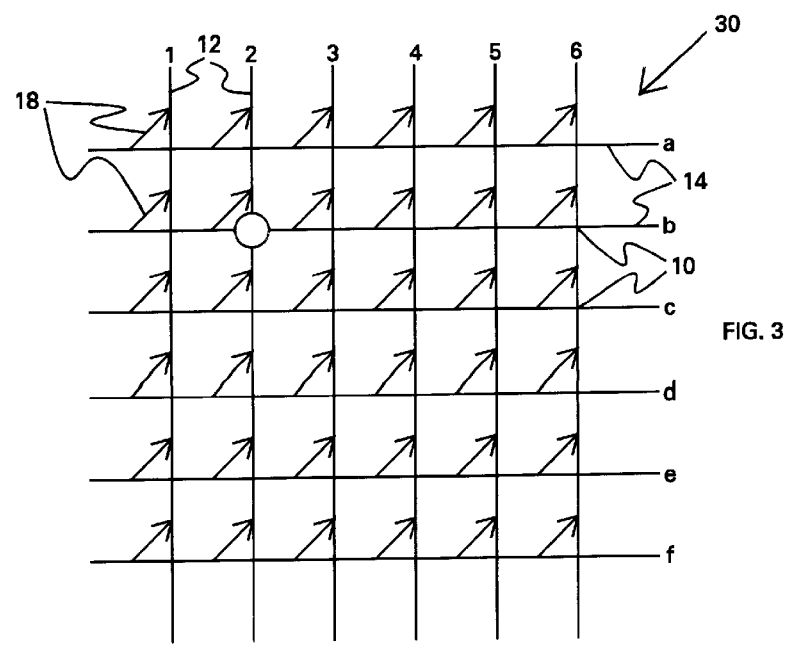
FIG. 3

MOLECULAR WIRE CROSSBAR MEMORY

CROSS-REFERENCE TO RELATED APPLICATIONS

The present application is related to the following applications: Ser. Nos. 09/282,045 ("Molecular Wire Crossbar Logic") [PD-10981969-1] 09/280,225 ("Molecular Wire Crossbar Interconnect") [PD-10981966-1] 09/282,049 ("Demultiplexer for a Molecular Wire Crossbar Network") [PD-10981970-1]; and 09/292,767 ("Chemically Synthesized and Assembled Electronic Devices") [PD-10981071-1], all filed on even date herewith. The present application employs the chemical synthesis and assembly techniques disclosed and claimed in 09/282,048 [PD-10981971-1] and the crossbar interconnections disclosed and claimed in 09/280,225 [PD-10981966-1].

TECHNICAL FIELD

The present invention relates generally to electronic devices whose functional length scales are measured in nanometers, and, more particularly, to memory devices based on crossed wires joined by bi-stable molecules at the intersecting junctions.

BACKGROUND ART

The silicon (Si) integrated circuit (IC) has dominated electronics and has helped it grow to become one of the world's largest and most critical industries over the past thirty-five years. However, because of a combination of physical and economic reasons, the miniaturization that has accompanied the growth of Si ICs is reaching its limit. The present scale of devices is on the order of tenths of micrometers. New solutions are being proposed to take electronics to ever smaller levels; such current solutions are directed to constructing nanometer scale devices.

Prior proposed solutions to the problem of constructing nanometer scale devices have involved (1) the utilization of extremely fine scale lithography using X-rays, electron, ions, scanning probes, or stamping to define the device components; (2) direct writing of the device components by electrons, ions, or scanning probes; or (3) the direct chemical synthesis and linking of components with covalent bonds. The major problem with (1) is that the wafer on which the devices are built must be aligned to within a fraction of a nanometer in at least two dimensions for several successive stages of lithography, followed by etching or deposition to build the devices. This level of control will be extremely expensive to implement. The major problem with (2) is that it is a serial process, and direct writing a wafer full of complex devices, each containing trillions of components, could well require many years. Finally, the problem with (3) is that the only known chemical analogues of high information content circuits are proteins and DNA, which both have extremely complex and, to date, unpredictable secondary and tertiary structures that causes them to twist into helices, fold into sheets, and form other complex 3D structures that will have a significant and usually deleterious effect on their desired electrical properties as well as make interfacing them to the outside world impossible.

The present inventors have developed new approaches to nanometer-scale devices, comprising crossed nano-scale wires that are joined at their intersecting junctions with bi-stable molecules, as disclosed and in application Ser. No. 09/282,048, filed on even date herewith [PD-10981971-1]. Wires, such as silicon, carbon and/or metal, are formed in two dimensional arrays. A bi-stable molecule, such as rotaxane, pseudo-rotaxane, or catenane, is formed at each intersection of a pair of wires. The bi-stable molecule is switchable between two states upon application of a voltage along a selected pair of wires.

The present inventors have also developed new approaches to nanometer-scale interconnect arrays as disclosed and in application Ser. No. 09/280,225, filed on even date herewith [PD-10981966-1]. A molecular-wire crossbar interconnect for signal routing and communications between a first level and a second level in a molecular-wire crossbar is provided. The molecular wire crossbar comprises a two-dimensional array of a plurality of nanometer-scale switches. Each switch is reconfigurable and self-assembling and comprises a pair of crossed wires which form a junction where one wire crosses another and at least one connector species connecting the pair of crossed wires in the junction. The connector species comprises a bi-stable molecule. Each level comprises at least one group of switches and each group of switches comprises at least one switch, with each group in the first level connected to all other groups in the second level in an all-to-all configuration to provide a scalable, defect-tolerant, fat-tree networking scheme. The primary advantage is ease of fabrication, because an active switch is formed any time two wires cross. This saves tremendously on circuit area (a factor of a few times ten), since no other wires or ancillary devices are needed to operate the switch or store the required configuration. This reduction of the area of a configuration bit and its switch to just the area of two crossing wires is a major advantage in constructing a defect-tolerant interconnect network.

Having developed a nanometer-scale crossbar innterconnect, effective utilization requires development of memories in order to construct a computer.

Magnetic random access memory (MRAM) is one route currently being explored for high density active memory applications, i.e., as a replacement for dynamic RAM (DRAM). The primary disadvantages of MRAM are that the spin-tunneling switch that is used to store individual bits at present only has about a 30% difference in resistance between the ON and OFF state, which means that memories must either be small or relatively slow to be read reliably. Such memories also would be damaged either by strong magnetic fields or by high temperatures, either of which can erase the memory. Finally, relatively large currents are required to set the sense of a bit, and this leads to problems with designing the electrical circuitry that accompanies the MRAM and also with the power consumption of the device.

There were also significant early attempts to build cross-point memories using ferroelectrics, but these were unsuccessful. The history of ferroelectric-based memories, especially the FeRAM, is described, for example, by R. E. Jones, Jr. et al, "Ferroelectric non-volatile memories for low-voltage, low-power applications", *Thin Solid Films,* Vol. 270, pp. 584–588 (Dec. 1, 1995).

The primary problem with ferroelectric cross-point memories has been crosstalk between memory elements—a phenomenon referred to as the 'half-select disturb-pulse'. Briefly, addressing a cell by splitting the write voltage between bit and word lines had the side effect that adjacent cells could be set as well. This occurred because of the fundamental properties of ferroelectrics, which do not have a sharp switching threshold voltage (they switch when a coercive field is exceeded, and there are many issues that vary the voltage required to achieve that field). Also, the switching depends upon the time over which a field is held, and thus there is a finite probability that a ferroelectric will switch if even a field below the coercive field is held on long enough. These problems have been addressed recently by using a pass-gate architecture in which each ferroelectric capacitor is controlled by its own field effect transistor (FET) (the 1T-1C configuration). Thus, the bit densities of these ferroelectric memories (FeRAM) will most likely never exceed the density of the FETs in the generation of CMOS (complementary metal-oxide semiconductor) used to build them. Another annoying issue with FeRAM is that reading a cell will necessarily destroy a bit if it is set "ON", and thus reading actually requires a read-rewrite cycle, which adds to the complexity, temporal overhead, and power consumption of the devices.

Thus, a need remains for high density memory, employing nanometer-scale architecture.

DISCLOSURE OF INVENTION

In accordance with the present invention, a molecular wire crossbar memory (MWCM) system is provided. The MWCM comprises a two-dimensional array of a plurality of nanometer-scale devices, each device comprising a junction formed by a pair of crossed wires where one wire crosses another and at least one connector species connecting the pair of crossed wires in the junction. The connector species comprises a bi-stable molecular switch. The junction forms either a resistor or a diode or an asymmetric non-linear resistor. The junction has a state that is capable of being altered or sensed by application of a voltage. The reading (sensing) voltage is of a non-destructive value, so as to avoid switching the state of the junction.

The physical advantages of the MWCM are in its scalability, low power consumption, the fact the switching elements have well-defined threshold voltages, low sensitivity to fields and temperature, and the read process is non-destructive. It is expected that as this architecture matures, it will eventually utilize carbon nanotubes, which have a diameter of about 1 nm and will certainly define the wiring limit for electronic devices. The MWCM is basically a voltage-controlled device, and therefore the fact that it contains components with relatively large resistance is actually an advantage in terms of power consumption. Also, the redox reactions that will be utilized as the switching elements at the crosspoints are voltage initiated, with values typically between 0.5 and 1 V. In fact, these threshold voltages are so reproducible that the technique of cyclic voltammetry, i.e. measuring the "waves" or steps in the I-V curve for such a redox reaction, has been used by chemists for decades as an analytical technique to determine what types of functional groups are present on an "unknown" molecule. Also, the size of the voltage required to change the state of the bit means the bit should be stable up to temperatures that would destroy the entire device, so the memory bits themselves will not be the most sensitive component of a system. Finally, the read of the bit is accomplished by determining the junction resistance by monitoring the tunneling current. The voltage used for the read process will be lower than that required to change the oxidation state of the switch molecules, so there will not be any problem with destroying the sense of the bit on reading it.

The MWCM of the present application resembles MRAM, which is a cross-point memory currently being developed both at IBM (see, e.g., U.S. Pat. No. 5,640,343) and at HP Labs (see, e.g., application Ser. No. 08/974,925, entitled "Solid-State Memory with Magnetic Storage Cells" [PD-10970365]). The MWCM is a non-volatile, re-writeable memory with a non-destructive read. It has the same fundamental architecture as current proposals for MRAMs, but the individual bits look at first like FeRAM capacitors.

MWCM has significant advantages over both MRAM and FeRAM. MWCM scales to much higher bit densities than the ultimate expected for either MRAM or FeRAM. Perhaps even more significant is the fact that a MWCM needs much less power than MRAM, which requires relatively large currents to set the sense of a bit.

BRIEF DESCRIPTION OF THE DRAWINGS

FIG. 2 is a schematic representation of two crossed nanowires, joined by a rotaxane, and depicting the two bi-stable states;

FIG. 3 is a schematic diagram depicting a resistive crossbar architecture in accordance with an embodiment of the present invention;

BEST MODES FOR CARRYING OUT THE INVENTION

Definitions

Figure 1A:
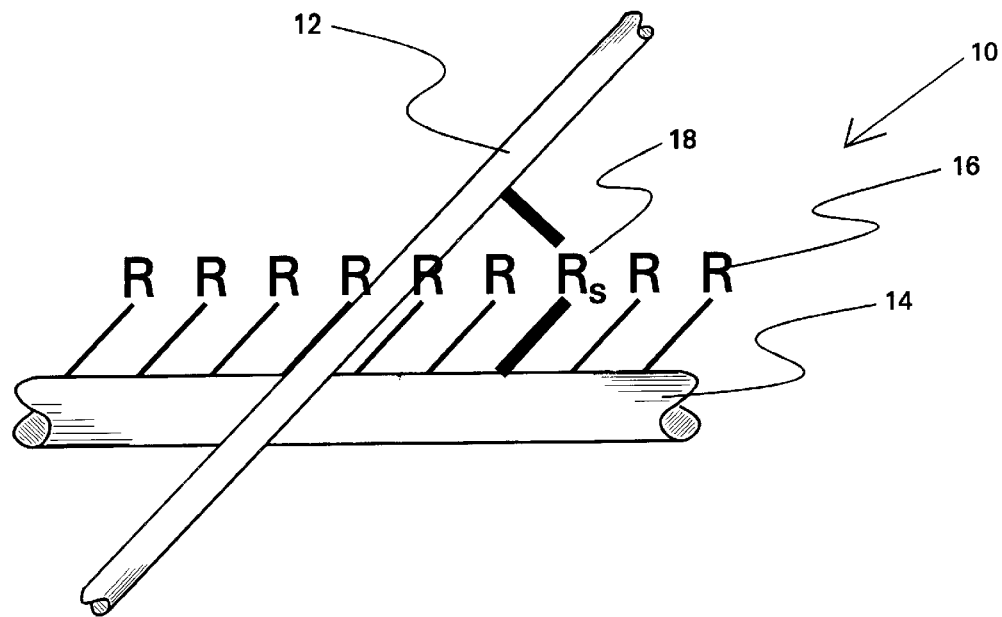
FIG. 1A is a schematic representation of two crossed nano-scale wires, with at least one molecule bridging the gap in accordance with the invention.

As used herein, the term "self-aligned" as applied to "junction" means that the junction that forms the switch and/or other electrical connection between two wires is created wherever two wires, either of which may be coated or functionalized, cross each other, because it is the act of crossing that creates the junction.

The term "self-assembled" as used herein refers to a system that naturally adopts some geometric pattern because of the identity of the components of the system; the system achieves at least a local minimum in its energy by adopting this configuration.

The term "singly configurable" means that a switch can change its state only once via an irreversible process such as an oxidation or reduction reaction; such a switch can be the basis of a programmable read only memory (PROM), for example.

The term "reconfigurable" means that a switch can change its state multiple times via a reversible process such as an oxidation or reduction; in other words, the switch can be opened and closed multiple times such as the memory bits in a random access memory (RAM).

The term "bi-stable" as applied to a molecule means a molecule having two relatively low energy states. The molecule may be either irreversibly switched from one state to the other (singly configurable) or reversibly switched from one state to the other (reconfigurable).

Micron-scale dimensions refers to dimensions that range from 1 micrometer to a few micrometers in size.

Sub-micron scale dimensions refers to dimensions that range from 1 micrometer down to 0.04 micrometers.

Nanometer scale dimensions refers to dimensions that range from 0.1 nanometers to 50 nanometers (0.05 micrometers).

Micron-scale and submicron-scale wires refers to rod or ribbon-shaped conductors or semiconductors with widths or diameters having the dimensions of 1 to 10 micrometers, heights that can range from a few tens of nanometers to a micrometer, and lengths of several micrometers and longer.

A crossbar is an array of switches that connect each wire in one set of parallel wires to every member of a second set of parallel wires that intersects the first set (usually the two sets of wires are perpendicular to each other, but this is not a necessary condition).

Crossed Wire Switch

In related patent application Ser. No. 09/282,048, filed on even date herewith [PD-10981971-1], a basic scheme for chemically synthesized and assembled electronic devices is provided. That application discloses and claims a quantum state switch, which comprises an adjustable tunnel junction between two nanometer-scale wires. In accordance with that invention, an electronic device is provided, comprising two crossed wires having nanometer dimensions, provided with functionalizing groups that control conductivity type of the wires. A plurality of such crossed wires may be assembled to provide a variety of different devices and circuits.

That invention enables the construction of electronic devices on a nanometer scale using relatively stiff wires that are chemically functionalized to provide the desired electronic properties and which are then chemically-assembled to create active electronic devices simply by forming contact with other wires.

Figure 1B:
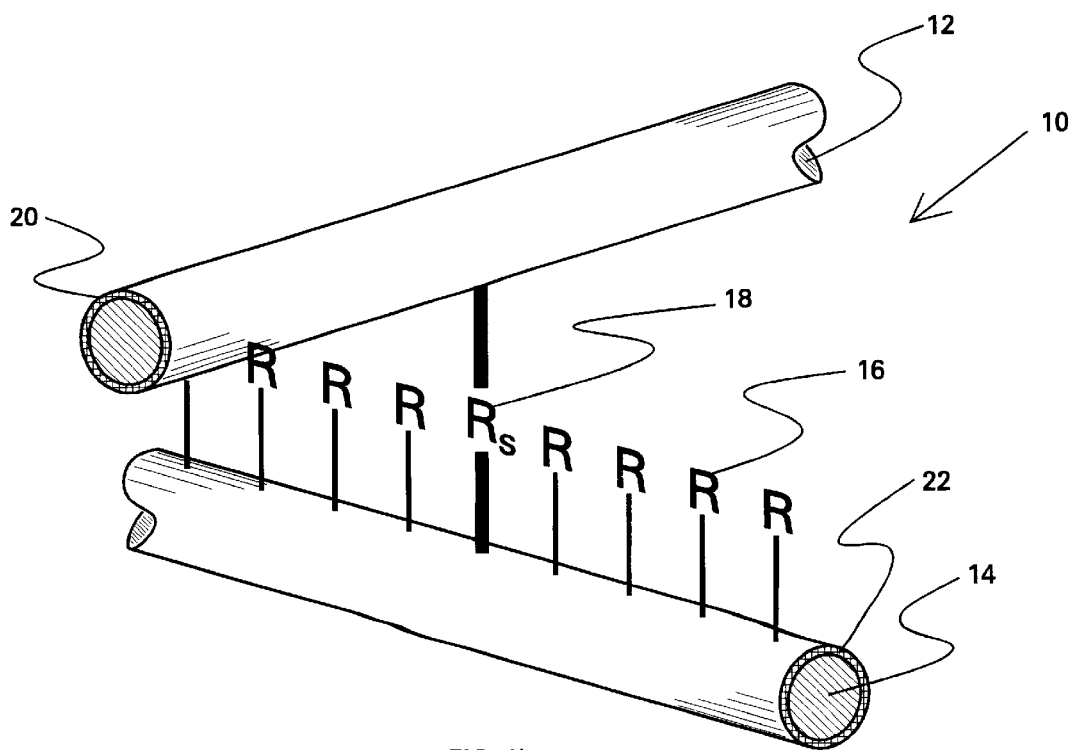
FIG. 1B is a perspective view, depicting the device shown in FIG. 1A.

The essential device features are shown in FIGS. 1A–1B. A crossed wire switch 10 comprises two wires 12, 14, each either a metal or semiconductor wire, that are crossed at some non-zero angle. In between those wires is a layer of molecules or molecular compounds 16, denoted R in FIGS. 1A and 1B. The particular molecules 18 (denoted $R_S$) that are sandwiched at the intersection, or junction, of the two wires 12, 14 are identified as switch molecules. When an appropriate voltage is applied across the wires, the switch molecules are either oxidized or reduced. When a molecule is oxidized (reduced), then a second species is reduced (oxidized) so that charge is balanced. These two species are then called a redox pair. One example of this device would be for one molecule to be reduced, and then a second molecule (the other half of the redox pair) is oxidized. In another example, a molecule is reduced, and one of the wires is oxidized. In a third example, a molecule is oxidized, and one of the wires is reduced. In a fourth example, one wire is oxidized, and an oxide associated with the other wire is reduced. In all cases, oxidation or reduction will affect the tunneling distance or the tunneling barrier height between the two wires, thereby exponentially altering the rate of charge transport across the wire junction, and serving as the basis for a switch.

Further, FIG. 1B depicts a coating 20 on wire 12 and a coating 22 on wire 14. The coatings 20, 22 may be modulation-doping coatings, tunneling barriers (e.g., oxides), or other nano-scale functionally suitable materials. Alternatively, the wires 12, 14 themselves may be coated with one or more R species 16, and where the wires cross, $R_S$ 18 is formed.

That invention allows electronic devices to be formed with a size on the order of tens of nanometers to a few nanometers simply by making contact between two wires. By choosing the molecules which form a doping layer on the wires (modulation doping), it is possible to build devices with a wide variety of specifically desired electrical properties. The possibility of reversibly or even irreversibly changing the properties of the device via an electrochemical reaction with a large hysteresis loop in its I-V characteristic enables devices to be altered after they are built and may provide new and useful functions.

The electronic device 10 of that invention, in its simplest state, is a quantum state switch comprising an adjustable tunnel junction 18 between two nanometer-scale wires 12, 14. A plurality of sets of wires, one set configured at an angle to the other, provides a two-dimensional array of switches. The wires are provided with a molecular species 16 at the junctions 18 that, in one embodiment, is bi-stable. The molecule species is addressed by setting voltages on the appropriate two wires. Thus, by the simple process of crossing one type of coated wire over the other, a switch is formed at wherever the intersection occurs; the exact position of the connecting point is not important for this architecture. Furthermore, the chemical species that form the molecular link between the wires can be electrochemically oxidized or reduced. Some types of molecules can be cycled reversibly and others will react irreversibly. The chemical state of the molecular switches determines the tunneling resistance between the two wires, which is exponentially dependent on both the width and the barrier height of the tunneling gap.

An example of a bi-stable molecular switch 110 is shown in FIG. 2, comprising a rotaxane 24. The rotaxane 24 contains two molecular components—a backbone 24a that contains one or more binding sites, and a circular molecule (the 'ring') 24b that fits around the backbone like a ring on a post. The ring 24b is in intimate mechanical contact, but is not chemically bonded to the backbone 24a. Depending on how the ring is fabricated, the ring may have one or more preferred minimum-energy locations along the backbone. In FIG. 2, these sites are denoted 26 (left site) and 28 (right site).

The moiety 29 on the left side of the rotaxane 24 shows that the molecule is asymmetric and therefore can have different properties when oxidized than when reduced.

Crossbar Memory

In accordance with the present invention, a plurality of devices 10 are configured in a two-dimensional array 30 to form a molecular wire crossbar memory (MWCM). One embodiment of the MWCM is shown in FIG. 3. The structure consists of two sets of overlapping nanowires 12, 14. Sandwiched between the wires are electrically addressable molecular switches 10. The switches are activated by electrochemical reduction or oxidation of the sandwiched molecule. Furthermore, the switches are designed to possess a large hysteresis in the voltammogram, so that a switch may be oxidized at a higher voltage, and its status may be read at a lower voltage. When a switch is (electrochemically) closed, the resistance between connecting wires is low, and this constitutes a "1". When the switch is opened, the resistance is high, and a "0" is stored. This network of two-terminal devices based on an array of hysteretic switches is similar in function to the "cross-point" Magnetic Random Access Memory (MAAM) described in the above-mentioned U.S. Pat. No. 5,640,343.

Figure 4A:
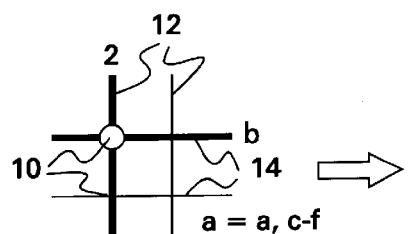
FIG. 4A depicts the process for reading the crossbar memory, employing a schematic diagram.
Figure 4B:
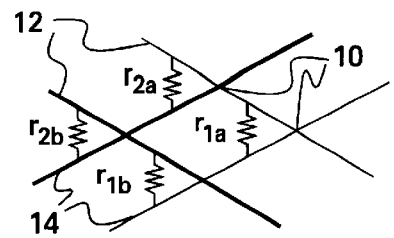
FIG. 4B also depicts the process for reading the crossbar memory, employing the equivalent electrical circuit.

As an example, and referring to FIGS. 4A–4B, cell "2b" is set by biasing wires "2" and "b", and effecting an oxidation or reduction of molecules that are sandwiched between the two wires. A change in the resistance across "2" and "b" signifies that a bit has been set.

There are several attractive aspects of this crossbar. First, it consists of periodic arrays of aligned wires 12, 14—something that is possible to chemically assemble. Second, it is very defect-tolerant, both at the level of individual switches, and as an entire unit. At every junction, there is not just one, but several (5 to 10) molecular switches. The switches 10 are set by electrically biasing both a bottom wire 12 and a top wire 14, and carrying out a solid-state reduction or oxidation of the half dozen or so switch molecules that reside in the junction. The result of this process is that the tunneling barrier (and probably the tunneling distance) between the two wires is altered, and thus a memory bit is set. Here, a 6×6 memory cell is shown, which will permit many non-functional memory elements and yet still store at least 16 bits in the device.

Reading the Memory

The memory 30 of the present invention is chemically assemblable because of the self-aligning properties of the wires 12, 14 and of the resistors 18 formed between the vertical and horizontal wires. The ability to select a bit and write to only that bit with a redox reaction which depends on the voltages of the crossing horizontal and vertical wires which define that specific bit is key to the functioning of the memory. But if resistors are formed at a given intersection, then there is a serious problem in reading the memory. The problem is that while the resistance between a given vertical and horizontal line, which are connected by an unknown resistor, can be measured, the parallel paths for current which go through all of the other possible resistors in the array are potentially of a much lower (and unknown) resistance than the resistance of interest. The way around this problem is to redefine the circuit that is being dealt with. Take the N horizontal wires and group them into the one wire of interest and all N-1 remaining horizontal wires that are tied to a common virtual ground. Do the same with the vertical wires. This turns an N×N problem into a 2×2 problem. Because of the virtual ground, there is a constraint on the solutions to the 2×2 problem.

Figure 5:
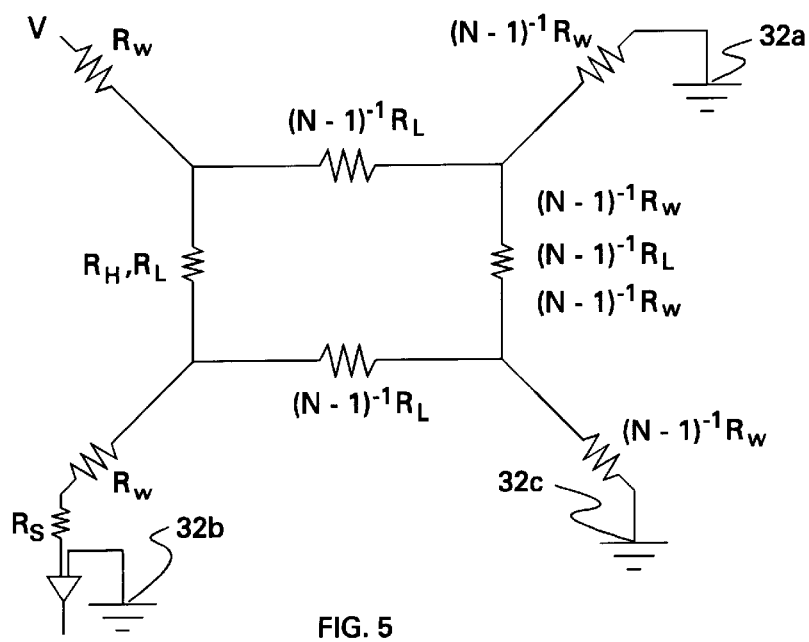
FIG. 5 depicts the effective circuit for reading the memory.

FIG. 5 shows the expanded circuit for reading the MWCM, and depicts the many redundant pathways through the system, where the measured resistance is dominated by those parallel pathways. This problem of scaling is not unique. DRAM, for example, scales in a similar way. If a system of DRAM memory elements get too large, then the capacitance of the system will mask the capacitance of a single memory bit.

In FIG. 5, $R_S$ is the sense amp resistance. $R_W$ is the wire resistance (the molecular wires themselves have a non-negligible resistance). $R_L$ is the low resistance value of a memory bit. $R_H$ is the high resistance value of a memory bit. N is the size of the array.

The problem as shown in FIG. 5 is to determine if the single resistor at the intersection of wire "1" and wire "a" has a value of $R_H$ or $R_L$ when all of the other resistors have an unknown value, which may be $R_L$ in the worst case.

This condition can be met if the current flowing to the sense amp is changed more by changing the resistor being measured from $R_H$ to $R_L$ than it is changed by changing all other bits from $R_H$ to $R_L$. From FIG. 5, this condition is equivalent to:

$$\frac{R_H}{R_L} \geq \left(1 + \frac{R_W + R_S}{R_W + R_L}(N-1)\right) \quad \text{Equation 1.}$$

Reasonable resistor values should allow construction of arrays of size N=100. The three grounds 32a, 32b, 32c shown in FIG. 5 are virtual grounds. The potential of a virtual ground is actively controlled by a feedback circuit. Equation 1 assumes that the feedback circuit can control the difference in potential between distinct virtual grounds to a precision better than the voltage drop across $R_W$.

Example of Reading the Memory

Reading the memory status of cell "2b", for example (FIGS. 4A and 4B), is carried out by shorting wire "1" with wires "3"–"6", and wire "a" with wires "c"–"f". (Wires "2" and "b" are shown thicker than the other wires only for illustrative purposes.) If the tunneling resistance of the junctions is significantly larger than the resistance of the wires (see Table I below), and if the resistance ratio between a "1" and a "0" is a factor of 3 (a conservative estimate, since tunneling resistance depends exponentially on both the barrier height and width), then less than 1 part in 10 sensitivity is needed to read the status of $R_{2b}$ (see Table I).

TABLE I

Various Percent Changes in the Measured Resistances (FIGS. 4A, 4B)

| # Elements | $R_{2b}$ (1/0) | $R_{1b}$ (1/0) | $R_{1a}$ (1/0) | $R_{2a}$ (1/0) |
|---|---|---|---|---|
| 36 | 20% | 9% | 2% | 9% |
| 100 | 13% | 6% | 1% | 6% |
| 10,000 | 1% | 1% | 0% | 1% |

Table I shows the various percent changes in the measured resistances (FIGS. 4A, 4B) that would occur between a "0" and a "1" for the worst case scenario of the non-diode MWC memory. This is for the worst case scenario (all other memory bits shorted to "1"). These values were computed using Equation 1. The resistive crossbar, as listed in Table I, does not scale to very large memory, and so it might be quite difficult to read a 100×100 (10 kilobit) MWC memory, for example, although it is expected to work fine for the 6×6 array depicted herein (36 element crossbar).

Diode Memory Array

Figure 6:
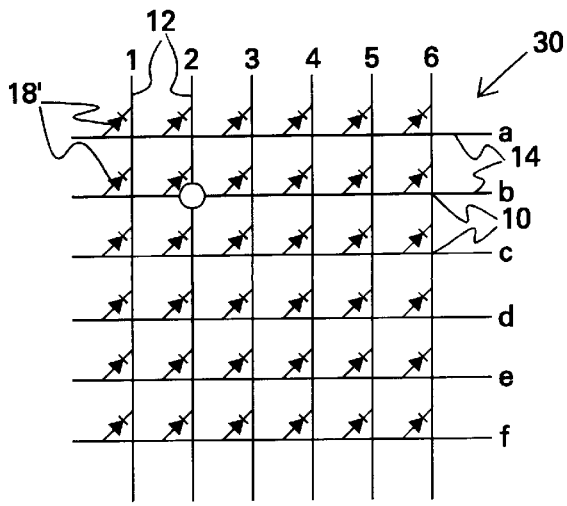
FIG. 6 is a schematic diagram similar to FIG. 3, but depicting a diode crossbar architecture in accordance with an embodiment of the present invention.

However, the problem of multiple unknown resistors in parallel to the resistor being measured can be solved by building diode behavior into the switches 18', as shown in FIG. 6. This is the type of approach used by IBM in their MRAM, but for the MWCM this can be done simply by using two different kinds of wires—one type for the vertical wires, and a second type for the horizontal wires. For example, by doping the horizontal and vertical wires 12, 14 differently, one to form P type and the other to form N type semiconductors, one can form diodes (FIG. 6).

Figure 7:
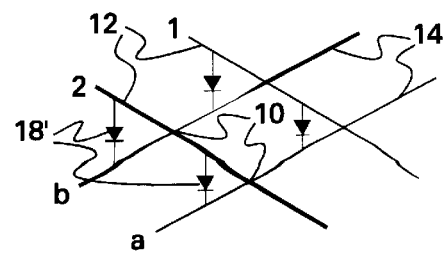
FIG. 7 is a schematic diagram similar to FIG. 4B, but depicting the diode crossbar equivalent circuit for reading out the memory.

As shown in FIG. 7, there is always one back-biased diode (e.g., from wire "a" to wire "1") in the extra paths for current which it is desired to eliminate. (Wires "2" and "b" are shown thicker than the other wires only for illustrative purposes.) This dramatically reduces the unknown signal which interferes with the signal to be measured. The effective leakage current is reduced, allowing the construction of much larger arrays. In effect, diode behavior guarantees that alternate pathways through the system are effectively blocked, as illustrated in FIG. 7.

This turns the worst case scenario (all bits "1") into, more or less, the best case scenario (all other bits "0"). If such diode behavior were built into a crossbar, then a 100×100 (10 Kbit memory) diode crossbar will require even less measurement sensitivity that the 6×6 resistive crossbar does.

Asymmetric Non-Linear Resistor Array

Alternatively to the diode implementation of the invention, the individual connection species 18 at the cross points either acts as an asymmetric non-linear resistor with relatively low resistance when it is forward biased and much higher resistance when it is reverse biased, or it acts as a very high resistance connection between the horizontal and vertical wires, depending on whether the memory bit is set to a "1" or a "0". This can be done with a single type of molecule. This also turns the worst case scenario (all bits "1") into, more or less, the best case scenario (all other bits "0"). If such asymmetric non-linear resistor behavior were built into a crossbar, then a 100×100 (10 Kbit memory) diode crossbar will require even less measurement sensitivity that the 6×6 resistive crossbar does.

EXAMPLE

Figure 8:
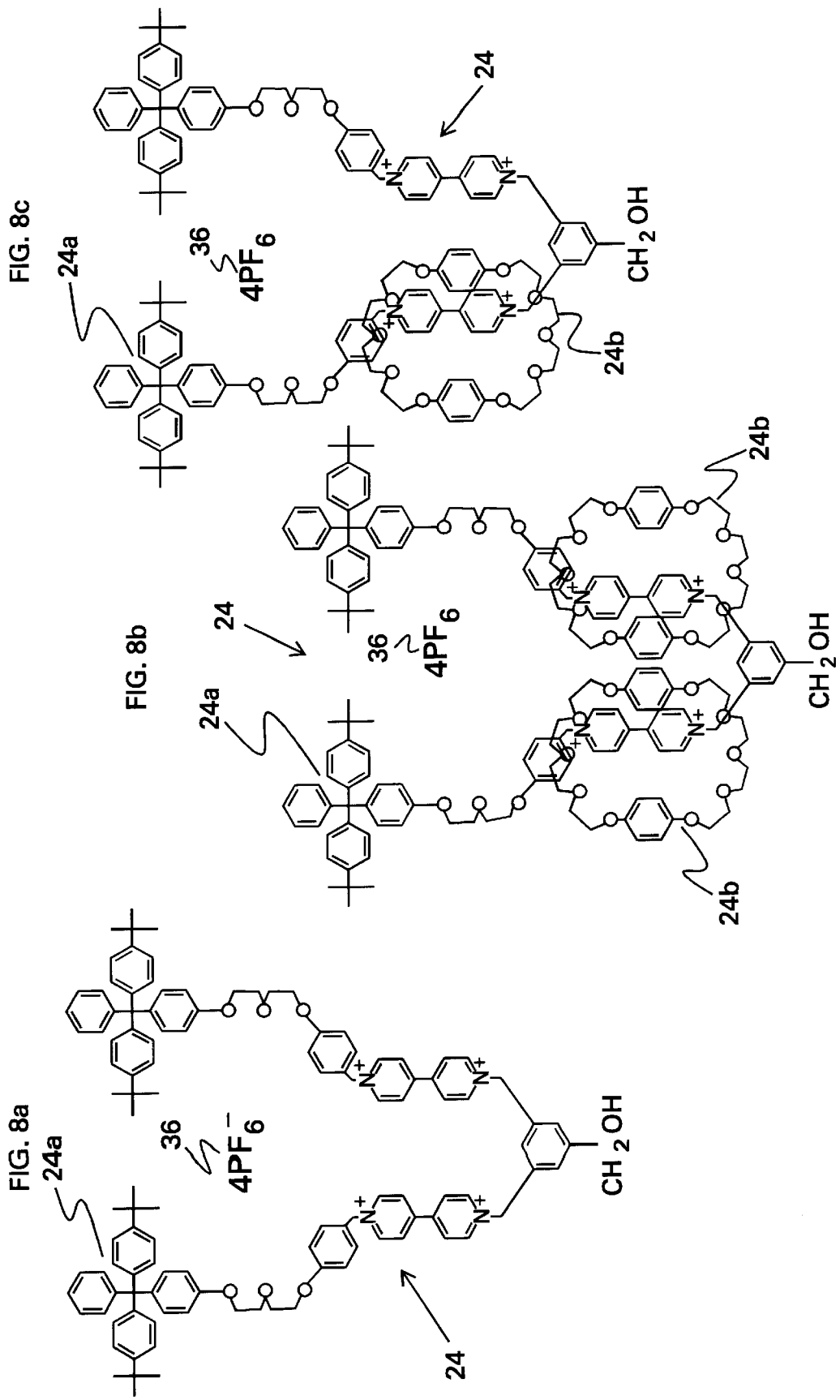
FIGS. 8A, 8B, and 8C depict the molecular structure of three molecular compounds, each of which was utilized to successfully reduce the present invention to practice.

A molecular switch-based device that could be configured as an electrically configurable read-only-memory bit was fabricated. The device was made as follows: a 5 micrometer wide aluminum wire 12 was deposited on a silica substrate using conventional lithographic procedures. The wire 12 was provided with an oxide coating 14 of $Al_2O_3$, which naturally formed to a thickness of about 1.0 to 1.5 nm when the aluminum wire was exposed to air. One of the molecular species shown in FIGS. 8A–8C was dissolved in tetrahydrofuran solvent, prepared as a Langmuir monolayer, and transferred as a Langmuir-Blodgett single molecular monolayer film 16 that covered the Al wire 12 and a silica substrate. The molecular compounds 24 shown in FIGS. 8A–8C are from a class of molecular compounds known as rotaxanes. Each molecular compound consists of a dumbbell component, or backbone, 24a, a counterion 36, and 0, 1, or 2 (bis-para-phenylene-34-crown-10) rings 24b (FIGS. 8A, 8C, and 8B, respectively).

The conditions for the preparation of the Langmuir monolayer 16 were a surface pressure of 28 milliNewtons/meter which yields a 1 $nm^2$/molecule surface coverage. Previous work on LB films of similar molecules has been reported; see, D. B. Amabilino et al, "Aggregation of self-assembling branched [n]-rotaxanes", *New Journal of Chemistry*, Vol. 22, No. 9, pp. 959–972 (Sep. 11, 1998).

A second, top wire 14 was deposited perpendicular to the first wire 12. The second wire 14 was deposited through a shadow mask using electron beam deposition techniques while the substrate was held at room temperature. For this top wire 14, a thin (5 nm) titanium layer was first deposited across the first wire 12, sandwiching a portion 18 of the molecular monolayer 16 between the Ti layer and the lower Al wire 12.

Next, the top wire of aluminum was deposited directly on top of the 11 micrometer wide Ti wire through the same shadow mask to an approximate thickness of one micrometer. This titanium/aluminum electrode 14 could be substituted with titanium/gold or chromium/aluminum electrodes, without affecting the basic device properties. Over 100 devices were made this way from each of the three molecular compounds shown in FIGS. 8A–8C, and the yield of operational switch junctions for each case was greater than 90%.

Figure 9:
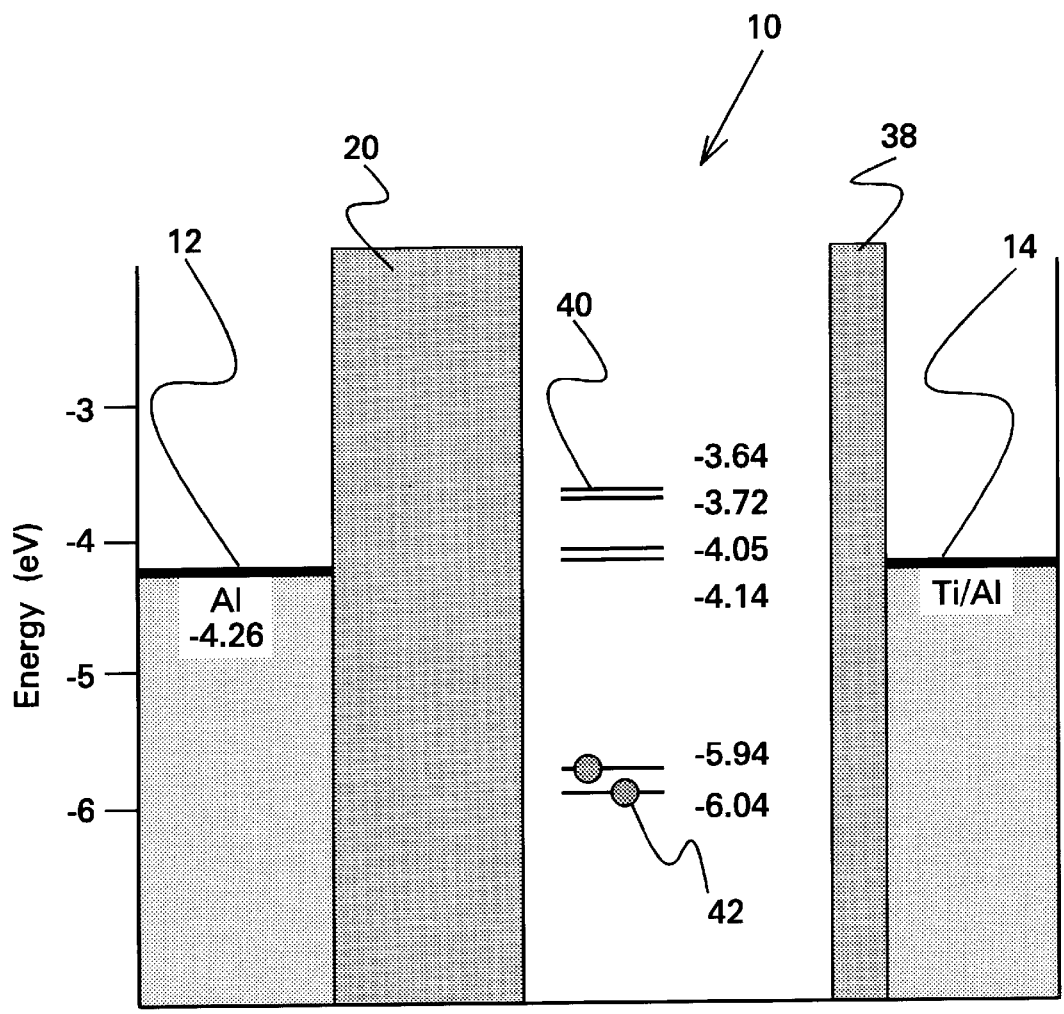
FIG. 9 depicts the energy level diagram of devices prepared utilizing the molecule depicted in FIG. 8C.
Figure 10A:
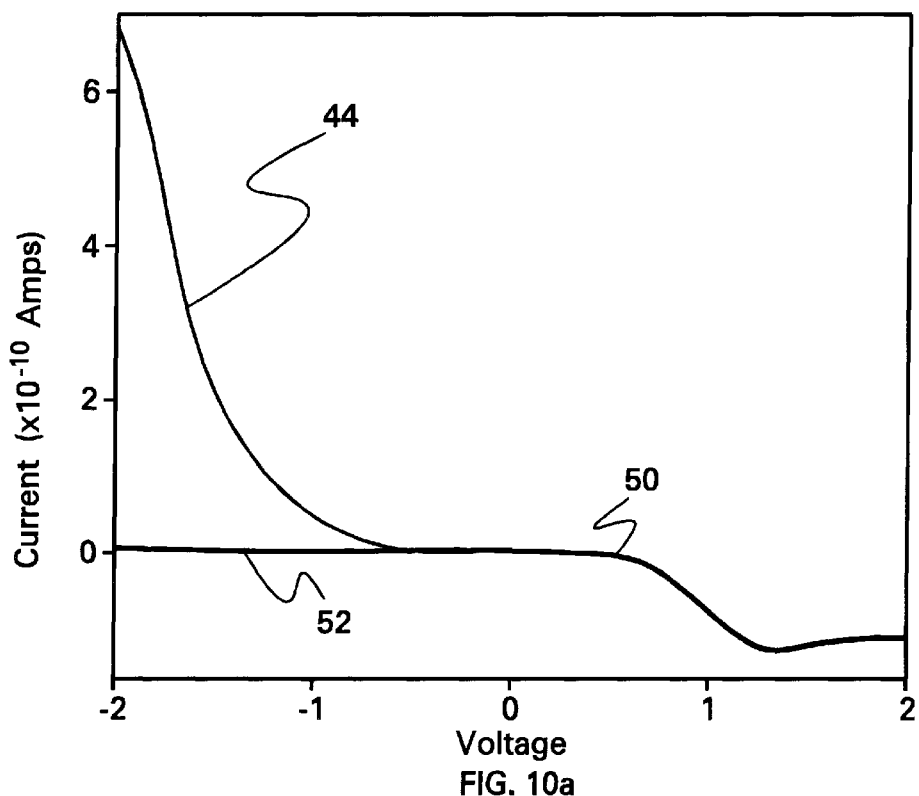
FIG. 10A, on coordinates of current (in amps) and voltage (in volts), is a plot depicting the electrical responses that were measured when a device of the present invention was reduced to practice utilizing the specific molecule depicted in FIG. 8C.
Figure 10B:
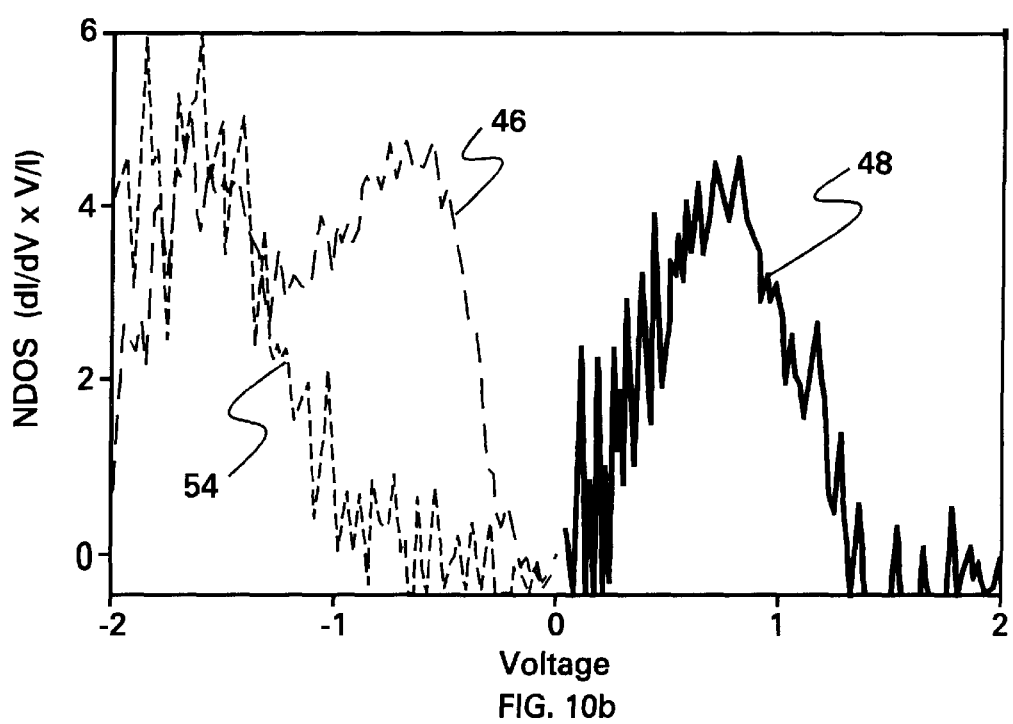
FIG. 10B, on coordinates of normalized density of states (dI/dV×V/I) and voltage (in volts), is a plot depicting an experimental measurement of the electronic energy levels of the molecular switch that was measured in FIG. 10A; the measurements indicate that the wire/molecule/wire junction acts as a resonant tunneling resistor in the 'switch-closed' state, and as a tunneling resistor in the 'switch-open' state.

The electronic energy level diagram of the device 10 is shown in FIG. 9. The energy levels (Fermi level) of the bottom aluminum electrode 12 and the top titanium/aluminum electrode 14 are indicated at either side of the diagram. The $Al_2O_3$ passivating layer 20, and the titanium/molecular interface layer 38 are indicated as tunneling barriers. The energy levels of one of the molecular compounds (FIG. 8C) (this particular molecule contained a dumbbell 24a, a counterion 36 and a single ring 24b) are indicated as either empty reducing levels 40 or as filled oxidation states 42. These energy levels were measured for this molecule using solution phase pulsed voltammetry. The operation of this device is demonstrated in FIGS. 10A–10B. For all device measurements, the titanium/aluminum electrode 14 was held at ground.

If a negative voltage is applied across the two wires 12, 14, then current tunnels between them. If the applied voltage is such that the empty electronic states 40 of the rotaxane are 'lined up' with the Fermi levels of one of the wires 14, then current flow is greatly enhanced by a resonant tunneling process, and a 'high' rate of current flow is measured in the area of the curve denoted 44 in FIG. 10A. This is defined as the 'switch closed' state. The normalized density-of-states measurement of this resonant tunneling process 46 (FIG. 10B) reveals that tunneling is occurring through the empty electronic states 40 of the rotaxane, thereby forming a resonant tunneling resistor that acts as a closed switch.

If a positive voltage is applied across the two wires 12, 14, then current again tunnels between them. If the applied voltage is such that the filled electronic states 42 (see also Curve 48 in FIG. 10B) of the molecules are 'lined up' with the Fermi levels of one of the electrodes 14, then the rotaxane is oxidized (see the portion of the curve denoted 50 in FIG. 10A). Oxidation of the rotaxane is irreversible, and physically changes its chemical structure, and thus the molecular electronic energy levels in the device 40, 42. When a second current-voltage scan from 0 to −2 Volts, denoted 52 in FIG. 10A, is again applied across the wires 12, 14, no resonant tunneling occurs from 0 to −1 V because the empty electronic states 40 of the rotaxane are no longer available (see Curve 54 in FIG. 10B). This forms a tunneling resistor that acts as an open switch. This is seen in the plot of the normalized density of states 54 for this scan 52. As a result, a 'low' rate of current flow is measured at 52.

The foregoing description is that of a singly configurable molecular switch, and can form the basis of programmable read only memory (PROM). The performance of this molecular switch is such that, at −1.8 volts, the ratio of the current flow between a switch 'closed' state 44 and a switch 'open' state 52 is a factor of sixty to eighty, depending on the particular device.

In the 'switch-closed' state, this device could be utilized as a resonant tunneling resistor (with an aluminum bottom electrode 12 and a titanium/aluminum top electrode 14), or a resonant tunneling diode (with a semiconductor, e.g. silicon, bottom electrode 12 and a titanium/gold top electrode 14). In the 'switch-open' state, this device was a tunneling resistor. A device that switches between a resonant tunneling resistor and a tunneling resistor or between a resonant tunneling diode and a tunneling resistor can be utilized to generate wired-logic gates, communications and signal routing circuitry, and programmable read-only memory. The fact that the electronic switching properties of these molecules is the same whether they are isolated molecules in solution (as probed by pulsed voltammetry), or as the junction molecules in these solid-state devices, indicates that these devices will scale from the micrometerscale dimensions of the working devices discussed here, to nanometer, or molecular scale dimensions, when these devices are fabricated according to the method described above. This example is an asymmetric non-linear resistor.

Thus, there has been disclosed a molecular wire crossbar memory comprising a junction formed by crossed wires joined by bi-stable molecules at the intersecting junctions. It will be apparent to those skilled in this art that various changes and modifications of an obvious nature may be made, and all such changes and modifications are considered to fall within the scope of the appended claims.

What is claimed is:

1. A two-dimensional memory array comprising a plurality of nanometer-scale devices, each device comprising a junction formed by a pair of crossed wires where one wire crosses another and at least one connector species comprising at least one bi-stable molecular switch and connecting said pair of crossed wires in said junction, said junction having a functional dimension in nanometers, wherein said at least one connector species and said pair of crossed wires form an electrochemical cell, with one set of wires formed above another set of wires.

2. The memory array of claim 1 wherein said junction forms a resistor.

3. The memory array of claim 1 wherein said junction forms a diode.

4. The memory array of claim 1 wherein said junction forms an asymmetric non-linear resistor.

5. The memory array of claim 1 wherein said junction has a state that is altered by application of a voltage.

6. The memory array of claim 1 wherein said junction has a state that is sensed by determining its resistance value.

7. The memory array of claim 1 wherein said at least one connector species forms a quantum state molecular switch comprising an electrically adjustable tunnel junction between said two wires.

8. The memory array of claim 1 wherein at least one of said two wires has a thickness that is about the same size as said at least one connector species, and over an order of magnitude longer than its diameter.

9. The memory array of claim 8 wherein both of said two wires have a thickness that is about the same size as said at least one connector species.

10. The memory array of claim 1 wherein both of said two wires have a thickness that ranges from sub-micrometer to micrometer.

11. The memory array of claim 1 wherein said junction is a singly configurable or reconfigurable switch.

12. The memory array of claim 1 wherein each said wire independently comprises a conductor or a semiconductor.

13. The memory array of claim 12 further including an insulating layer or a modulation-doped layer on at least one of said wires.

14. The memory array of claim 13 wherein said insulating layer comprises an oxide.

15. The memory array of claim 12 wherein said semiconductor is internally doped.

16. A method of storing and/or reading bits in a two-dimensional memory array, said method comprising:

(a) providing said two-dimensional memory array comprising a plurality of nanometer-scale devices, each device comprising a junction formed by a pair of crossed wires where one wire crosses another and at least one connector species connecting said pair of crossed wires in said junction, said at least one connector species comprising a bi-stable molecule having two states and existing in one of said states; and (b) biasing two wires defining a selected junction either to change said state of said at least one connector species in said junction to store a said bit or to sense said state of said at least one connector species in said junction to read a said bit.

17. The method of claim 16 wherein said junction forms a resistor.

18. The method of claim 16 wherein said junction forms a diode.

19. The method of claim 16 wherein said junction forms an asymmetric non-linear resistor.

20. The method of claim 16 wherein said biasing is performed by application of a first voltage to store said bit and by application of a second voltage to sense a stored bit.

21. The method of claim 20 wherein said second voltage is of a non-destructive value that does not change said state of said junction.

22. The method of claim 16 wherein said junction has a state that is sensed by determining its resistance value.

23. The method of claim 16 wherein said at least one connector species forms a quantum state molecular switch comprising an electrically adjustable tunnel junction between said two wires.

24. The method of claim 16 wherein at least one of said two wires has a thickness that is about the same size as said at least one connector species, and over an order of magnitude longer than its diameter.

25. The method of claim 24 wherein both of said two wires have a thickness that is about the same size as said at least one connector species.

26. The method of claim 16 wherein both of said two wires have a thickness that ranges from sub-micrometer to micrometer.

27. The method of claim 16 wherein said junction is a singly configurable or reconfigurable switch.

28. The method of claim 16 wherein each said wire independently comprises a conductor or a semiconductor.

29. The method of claim 28 further including an insulating layer or a modulation-doped layer on at least one of said wires.

30. The method of claim 29 wherein said insulating layer comprises an oxide.

31. The method of claim 28 wherein said semiconductor is internally doped.

* * * * *